US008581306B2

(12) United States Patent
Blick et al.

(10) Patent No.: US 8,581,306 B2
(45) Date of Patent: Nov. 12, 2013

(54) COUPLED ELECTRON SHUTTLE PROVIDING ELECTRICAL RECTIFICATION

(71) Applicant: Wisconsin Alumni Research Foundation, Madison, WI (US)

(72) Inventors: Robert H. Blick, Madison, WI (US); Chulki Kim, Madison, WI (US); Jonghoo Park, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 13/769,723

(22) Filed: Feb. 18, 2013

(65) Prior Publication Data

US 2013/0182481 A1 Jul. 18, 2013

Related U.S. Application Data

(63) Continuation of application No. 12/756,776, filed on Apr. 8, 2010, now Pat. No. 8,378,895.

(51) Int. Cl.
*H01L 29/76* (2006.01)

(52) U.S. Cl.
USPC ............ 257/213; 257/414; 257/416; 438/144

(58) Field of Classification Search
USPC ........... 257/213, 215, 414, 416; 438/142, 144
See application file for complete search history.

(56) References Cited

U.S. PATENT DOCUMENTS

| | | | | |
|---|---|---|---|---|
| 6,396,440 | B1 | 5/2002 | Chen | |
| 6,653,653 | B2 * | 11/2003 | Brousseau, III | 257/39 |
| 6,700,693 | B2 * | 3/2004 | Roberts et al. | 359/265 |
| 6,946,693 | B1 | 9/2005 | Sheible et al. | |
| 7,214,571 | B2 | 5/2007 | Sheible et al. | |
| 7,307,589 | B1 | 12/2007 | Gregoire et al. | |
| 7,373,535 | B2 * | 5/2008 | Kwon | 713/320 |
| 7,456,803 | B1 | 11/2008 | Sievenpiper | |
| 7,776,661 | B2 * | 8/2010 | Qin et al. | 438/144 |
| 8,045,947 | B2 | 10/2011 | Mandal et al. | |
| 2009/0015351 | A1 | 1/2009 | Qin et al. | |
| 2010/0119668 | A1 * | 5/2010 | Maupin et al. | 426/237 |

OTHER PUBLICATIONS

Ahn, Kang-Hun, et al., Current Rectification by Spontaneous Symmetry Breaking in Coupled Nanomechanical Shuttles, Physical Review Letter, Nov. 24, 2006, PRL 97, 216804 (2006), pp. 216804-1-216804-4, The American Physical Society, College Park, Maryland, USA.

Hagerty, Joseph A., et al, Recycling Ambient Microwave Energy with Broad-Band Rectenna Arrays, IEEE Transactions on Microwave Theory and Techniques, vol. 53, No. 3, pp. 1014-1024, IEEE, New York, New York, USA.

Van Norel, Jan, PCT International Search Report and Written Opinion, dated May 3, 2011, European Patent Office, Rijswijk, The Netherlands.

Scheible, Dominik V. et al, Silicon Nanopillars for Mechanical Single-Electron Transport, vol. 84, No. 23, Jun. 7, 2004, pp. 4632-4634, Applied Physiics Letters, AIP, Americcan Institute of Physicas, Melville, NY, USA.

Hagerty, Joseph A., et al., Broadband Rectenna Arrays for Randomly Polarized Incident Waves, Oct. 1, 2001, pp. 1-4, European Microwave Conference, 2000. 30th IEEE, Pscataway, NJ, USA.

Chulki, Kim et al., Spontaneous Symmetry Breaking in Two Coupled Nanomechanical Electron Shuttles, vol. 105, No. 6, Aug. 6, 2010, pp. 067204/1-067204/4, Physical Review Letters, The American Physical Society, College Park, Maryland, USA.

* cited by examiner

*Primary Examiner* — Tho G Phan
(74) *Attorney, Agent, or Firm* — Boyle Fredrickson, S.C.

(57) ABSTRACT

A nanoscale electron shuttle with two elastically mounted conductors positioned within a gap between conductors produces asymmetrical electron conduction between the conductors when the conductors receive an AC signal to provide for rectification, detection and/or power harvesting.

13 Claims, 3 Drawing Sheets

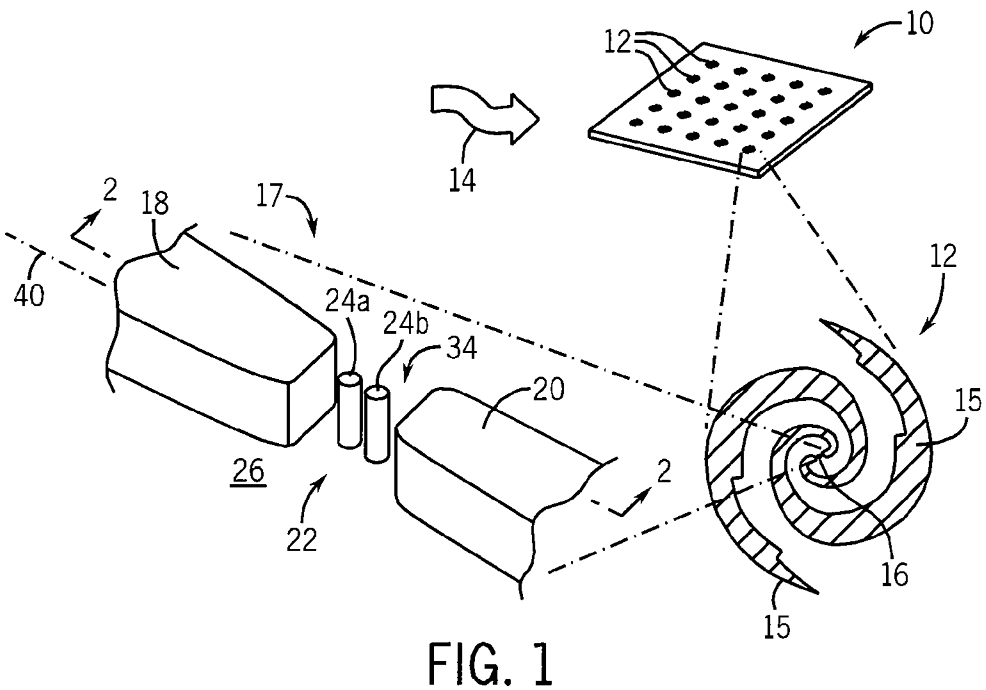
FIG. 1
FIG. 2
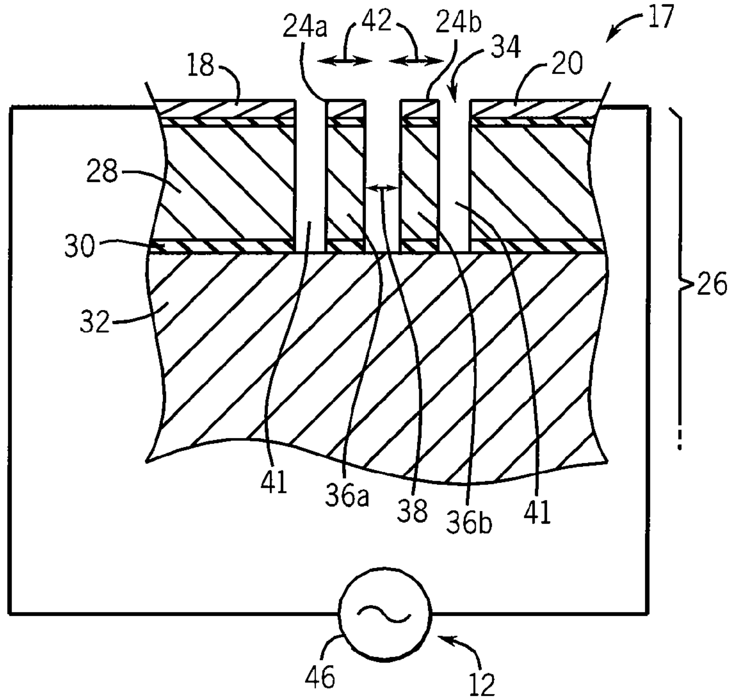

COUPLED ELECTRON SHUTTLE PROVIDING ELECTRICAL RECTIFICATION

CROSS-REFERENCE TO RELATED APPLICATIONS

This application is a divisional application of U.S. application Ser. No. 12/756,776 filed Apr. 8, 2010 hereby incorporated by reference.

STATEMENT REGARDING FEDERALLY SPONSORED RESEARCH OR DEVELOPMENT

This invention was made with government support under N66001-07-1-2U46 awarded by the US Navy and FA9550-08-1-0337 awarded by the USAF/AFOSR. The government has certain rights in the invention.

BACKGROUND OF THE INVENTION

The present invention relates to devices for converting free-space electromagnetic radiation to electrical power and in particular to a rectification element employing an electron shuttle useful for such a device.

"Rectennas" are antennas that may receive radio signals and rectify them to generate electrical power for wireless power transfer. An example rectenna system was used in 1964 to power a tethered helicopter holding the rectenna and receiving a beam of microwave radiation from a ground-based microwave transmitter.

Potential applications for rectennas include both large-scale power transfer applications such as the communication of power between satellite and earth based stations as well as smaller scale applications such as powering RFID tags, biomedical implants, or the like. The use of rectennas is not limited to radio signals but has been proposed for electromagnetic signals at light frequencies as an alternative to standard photocells.

A limitation in the use of rectennas, particularly for low power density radiation, comes from the rectifying element necessary to convert an electromagnetic signal to useful power. A free-space electromagnetic signal will, in general, be an alternating current (AC) signal with an average current (and voltage) of zero (zero bias). In order to obtain useful continuous electrical power, the AC signal normally must be converted by rectification to a signal with a non-zero average (DC signal).

Standard junction semiconductors, such as pn diodes, may be used for rectification but are relatively inefficient and have high forward bias voltages resulting in lost power in the junction during the rectification process. Such high forward bias values can also make it impractical to extract power from low power density signals where these voltages are not readily obtained at the antenna output. For light frequency electromagnetic signals, the junction capacitance of a standard junction diode can prevent the required high-speed operation.

SUMMARY OF INVENTION

The present invention provides a rectifier using an electron shuttle that operates by transferring electrons between two terminals in vibratory mode which may be asymmetrical under certain operating conditions to rectify current. The potentially high-speed operation of this rectifier and low energy loss may permit improved rectenna design.

In one embodiment, the present invention provides a power collector for electromagnetic radiation having an antenna structure tuned into at least one wavelength of a free-space electromagnetic signal and a rectification unit communicating with the antenna structure. The rectification unit includes a first and second electrical conductor having corresponding first and second ends approaching each other across a gap and at least two elastically mounted conducting elements positioned within the gap, each to permit shuttling of electrons between each other and at least one of the first and second electrical conductors with vibration of the two elastically mounted conducting elements. The conducting elements operate in a coupled mode to provide a non-zero, average current flow between the first and second electrical conductor when excited by an electrical signal of the free-space electromagnetic signal.

It is thus a feature of at least one embodiment of the invention to provide a new rectenna design having substantially improved performance particularly for low power density signals.

The elastically mounted conducting elements may have a static separation from one of the first and second ends of less than 100 nanometers. The height of the pillars may be less than 1000 nm and a diameter of the pillars maybe less than 100 nm.

It is thus a feature of at least one embodiment of the invention to provide a nanoscale device suitable for efficient high-frequency operation.

The first and second electrical conductors may be metallization layers on a planar substrate and the elastically mounted conducting elements may be metallization layers on the top of pillars extending upward from the substrate from a depression between the first and second electrical conductors. The substrate may be a silicon-on-oxide substrate and the pillars may terminate in the oxide layer for electrical isolation.

It is thus a feature of at least one embodiment of the invention to provide a simple method of producing the necessary electrically isolated elements using standard integrated circuit techniques and materials.

The arrangement of the elastically mounted conducting elements with respect to the first and second electrical conductors and/or the shape of at least one of the elastically mounted conducting elements and the first and second electrical conductors may include a predetermined asymmetry to promote a predetermined direction of spontaneous symmetry breaking.

It is thus a feature of at least one embodiment of the invention to produce predictable spontaneous symmetry breaking necessary for a practical rectifier.

The first and second electrical conductors may be brachiated to have multiple first and second ends each with corresponding elastically mounted conducting elements, the conducting elements operating in a coupled mode to provide parallel current flow between the first and second electrical conductors.

Alternatively or in addition, the power collector may further include a third and fourth electrical conductor having corresponding first and second ends approaching each other across a gap and at least two elastically mounted conducting elements positioned within the gap to permit shuttling of electrons between each other and at least one of the third and fourth electrical conductors with vibration of the two elastically mounted conducting elements so that the conducting elements operate in a coupled mode to provide a net average current flow between the third and fourth electrical conductor when excited by an AC waveform applied across the first and second electrical conductor having an average value of zero.

The second conductive element may be connected to the first conduct development to provide for serial current flow from the first conductive element to the fourth conductive element.

It is thus a feature of at least one embodiment of the invention to provide a rectification system having an arbitrary current capacity or voltage breakdown by the parallel and/or serial connection of many devices.

The rectification unit may provide rectification in a first polarity at a first set of frequencies and may further include a frequency filter selectively passing the first set of frequencies from the antenna to the rectification unit.

It is thus a feature of at least one embodiment of the invention to preprocess the electromagnetic signal to promote operation at a given polarity and/or efficiency.

The frequency filter may be implemented at least in part by antenna geometry.

It is thus a feature of at least one embodiment of the invention to provide a simple and flexible way of eliminating inefficient modes of operation, for example, of frequencies which cause reverse current flow.

These particular features and advantages may apply to only some embodiments falling within the claims and thus do not define the scope of the invention.

BRIEF DESCRIPTION OF THE FIGURES

FIG. 1 is a perspective exploded view of a rectenna of the present invention showing an array of antennas each having an associated rectification unit comprised of at least two vibratory pillars separated across a gap;

FIG. 2 is a cross-sectional view along line 2-2 of FIG. 1 showing the suspension of conducting elements on top of the pillars as metallization layers;

DETAILED DESCRIPTION OF THE PREFERRED EMBODIMENT

Figure 3:
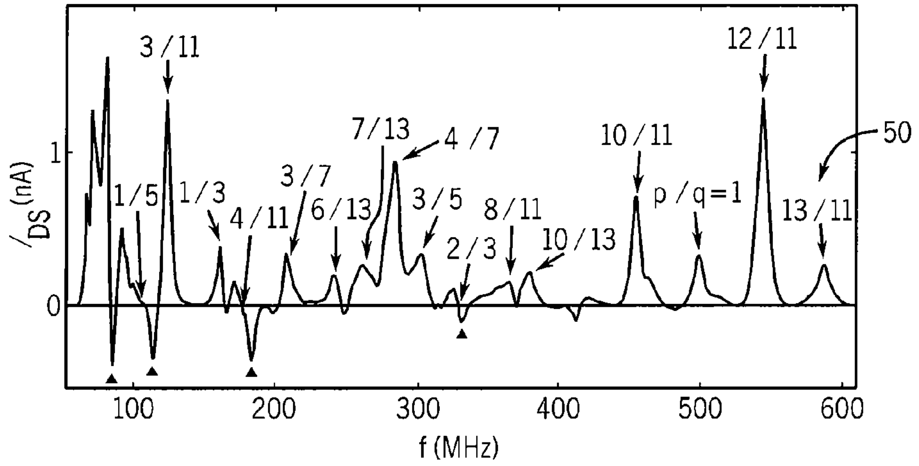
FIG. 3 is a graph showing DC current obtained across the gap of the rectification circuit at different frequencies.

Referring now to FIG. 1, antenna array 10 of the present invention may provide for multiple antenna elements 12 designed to receive electromagnetic radiation 14. The multiple antenna elements 12 maybe electrically interconnected in series or in parallel to provide for desired power voltage and current as will be described below.

Each antenna element 12 may, for example, be a dipole providing for a pair of arms 15, here shown in a spiral configuration, for broadband frequency sensitivity. The arms 15 may connect to a rectification element 16 for extracting power from the electromagnetic radiation 14 received by the antenna element 12. The rectification element 16 may be an individual rectifier or a full wave bridge of a type understood in the art comprised of one or more rectifiers 17.

Referring also to FIG. 2, each rectifier 17 may include a first and second conductor 18 and 20 opposed across a gap 22 containing a first and second elastically mounted conducting element 24*a* and 24*b* therebetween. The rectifier 17 may be constructed on a substrate 26, for example, a silicon on insulator (SOI) wafer having a first upper silicon layer 28 approximately 190 nm in thickness separated by a thin silicon dioxide insulator 30 of approximately 350 nm thickness from a lower silicon handle 32 of arbitrary thickness. The first and second conductor 18 and 20 may be metallization layers on top of the upper silicon layer 28.

A depression 34 in the form of a channel may be etched between proximate ends of the conductors 18 and 20 excluding the material of two pillars 36*a* and 36*b* extending upward from the depression 34 and aligned along an axis 40 extending between the first and second conductors 18 and 20. The upper ends of the pillars 36*a* and 36*b* may be metalized to create two elastically mounted conducting elements 24*a* and 24*b*, the elasticity provided by flexure of the pillars 36*a* and 36*b*.

The pillars 36 may be approximately 250 nm tall with a diameter of approximately 65 nm. A spacing 38 between the pillars may be 17 nm and less than the gaps 41 between either pillar 36*a* or 36*b* and the closest conductor 18 or 20. This spacing provides increased electrostatic communication between the pillars 36*a* and 36*b* providing the necessary coupling for spontaneous symmetry breaking as will be described. The gaps 41 are approximately equal making the structure essentially symmetric along the axis 40 extending from conductor 18 to conductor 20 and through each of elastically mounted conducting elements 24*a* and 24*b*. Pillar diameter as used herein refers to the diameter of a cylinder that would closely contain the pillar with the pillar axis aligned with the cylinder axis and does not require that the pillars be perfect cylinders.

An alternating current electrical signal 46 from one or more antenna elements 12 maybe applied across conductors 18 and 20 to promote a vibratory oscillation 42 of the pillars 36*a* and 36*b* under the influence of the variable electrostatic field between the conductors 18 and 20. This vibratory oscillation 42 may have a component aligned with axis 40 but will generally occur in three dimensions to provide for complex vibratory modes.

During in the vibratory oscillations 42, elastically mounted conductive elements 24*a* and 24*b* may exchange charges between conductive element 24*a* and conductor 18 and between conductive element 24*b* and conductor 20 by electron tunneling. The general operation and construction of such charge transfer devices is described, for example, in: "Nanopillar Arrays On Semiconductor Membranes As Electron Amplifiers", H. Qin, H. S. Kim, and R. H. Blick, Nanotechnology 19, 095504 (2008); "Field Emission from a Single Nanomechanical Pillar", Hyun-Seok Kim, Hua Qin, Lloyd M. Smith, Michael Westphall, and Robert H. Blick, Nanotechnology 18, 065201 (2007); "Effects of Low Attenuation in a Nanomechanical Electron Shuttle", D. V. Scheible, Ch. Weiss, and R. H. Blick, Journal of Applied Physics 96, 1757 (2004); "A Quantum Electro Mechanical Device: The Electro-Mechanical Single Electron Pillar", Robert H. Blick and D. V. Scheible, Superlattices and Microstructures 33, 397 (2004); "Silicon Nano-Pillars for Mechanical Single Electron Transport", D. V. Scheible and R. H. Blick, Applied Physics Letters 84, 4632 (2004); "Nanomechanical Resonator Shuttling Single Electrons at Radio Frequencies", A. Erbe, Ch. Weiss, W. Zwerger, and R. H. Blick, Physical Review Letters 87, 096106 (2001); "Coulomb blockade in Silicon Nanostructures", A. Tilke, F. Simmel, R. H. Blick, H. Lorenz, and, J. P. Kotthaus, Progress in Quantum Electronics 25, 97 (2001), all hereby incorporated by reference.

Referring now to FIG. 3, at different frequencies of the signal 46 (having an average or DC voltage of zero per a free-space electromagnetic signal), a net average current $I_{DS}$ will flow between conductor 18 and 20. While the inventors do not wish to be bound by a particular theory, this rectification is believed to be caused by spontaneous symmetry breaking theoretically predicted by Ahn, K. H., Park H. C., Wiersig J, Hong J. as described in the paper: "Current Rectification By Spontaneous Symmetry Breaking In Coupled Nanomechanical Shuttles", Phys. Rev. Lett. 2006 Nov. 24; 97(21): 216804. Epub 2006 Nov. 22, hereby incorporated by reference. This spontaneous symmetry breaking results in an asymmetrical current flow despite the symmetrical structure of the rectifier 17. In the graph of FIG. 3, a number of resonance peaks are shown labeled with fractions p/q based on a deduced fundamental mode at 504 MHz where p/q equals one. It should be noted that the upwardly extending peaks represent the first polarity of current rectification while the downwardly extending peaks represent the opposite direction of current rectification. Referring momentarily to FIG. 1, the antenna elements 12 may be tuned to preferentially receive only the frequencies of the upward (or downwardly) extending peaks to ensure maximum power harvesting capabilities. Alternatively, a filter may be placed between the antenna and the rectification element 16 to accomplish a similar purpose.

Figure 4:
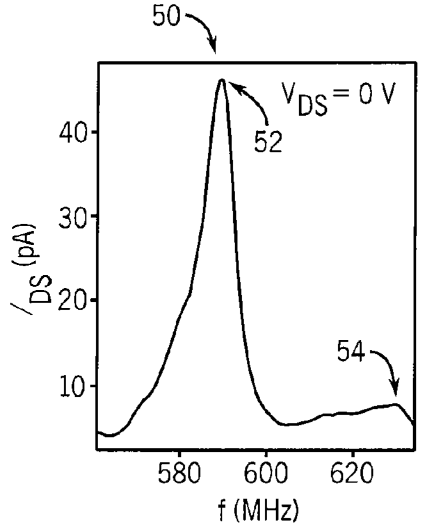
FIG. 4 is an expanded portion of the graph of FIG. 3 at approximately 589 MHz showing on and off resonance points having greater and lesser DC current flow.
Figure 5:
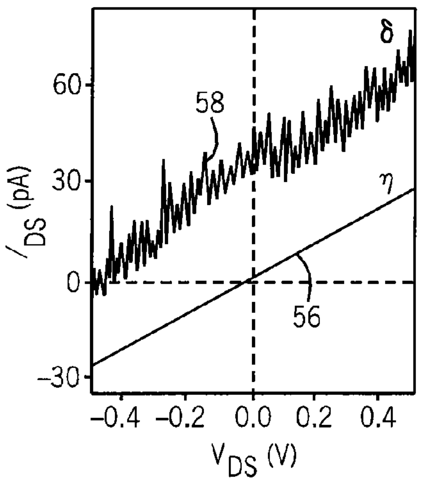
FIG. 5 is an IV-diagram comparing current flow at the on and off resonance points of FIG. 4 showing rectification at the on resonance.

Referring now to FIG. 4, a detail of one peak 50 of FIG. 3 is shown for two operating frequencies: on-resonance frequency 52 and off-resonance frequency 54. FIG. 5 shows the current-voltage characteristics at these frequencies of approximately 590 MHz and 630 MHz, respectively. Of significance, the IV-curve 56 for the off-resonance frequency 54 passes closely through zero current and zero voltage in the manner of a conventional resistor whereas the curve 58 for the on-resonance frequency 52 shows a current of approximately 30 pico amps at zero voltage. The voltage indicated in the IV-curve is the average voltage or DC offset of the signal 46. Accordingly at resonance, a rectification of the signal 46 occurs.

Figure 6:
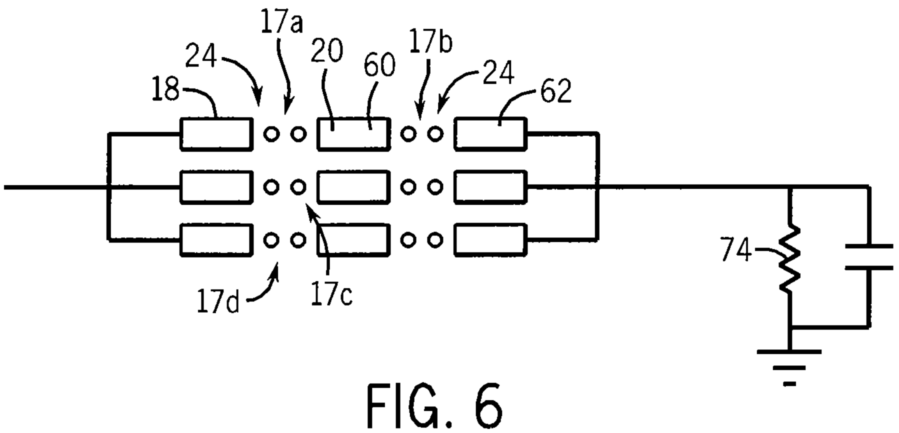
FIG. 6 is a simplified diagram of the rectification unit of the present invention showing the arraying of multiple units in series and parallel connections.

Referring now to FIG. 6, the rectification element 16 of the present invention may be assembled in series chains of rectifiers 17 as indicated by rectifier 17*a* and 17*b* where the first conductor 18 is positioned across a first set of elastically mounted conductive elements 24 from a second conductor 20 which is joined to a third conductor 60 positioned across a second set of elastically mounted conductive elements 24 from a fourth conductor 62 so that current flows in series from conductor 18 to 62. This configuration decreases the amount of voltage across each element 24 thus allowing higher voltage capacity of the rectification element 16.

Alternatively or in addition, rectifier 17*a* may be placed in parallel with rectifier 17*c* and 17*d* so the current may pass in parallel through each of these rectifying elements increasing the total current handling capacity of the rectification element 16.

Figure 7:
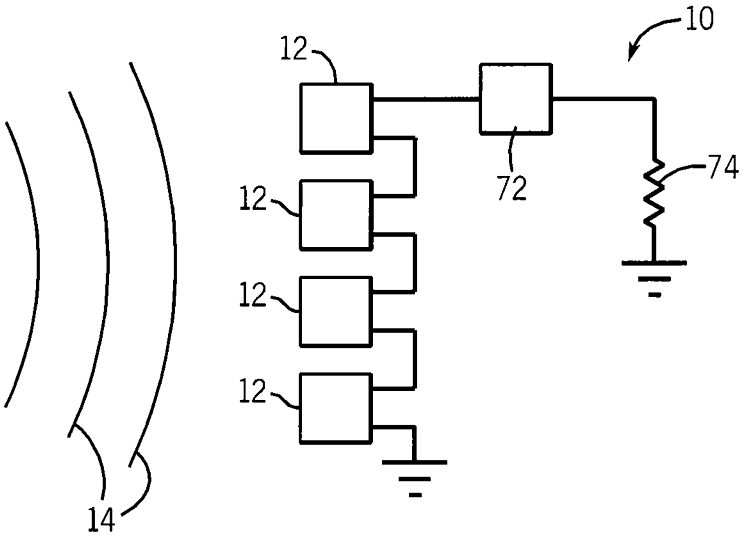
FIG. 7 is a block diagram of the electrical connection of multiple antennas of a rectenna using the present invention.

Referring now to FIG. 7, the antenna array 10 may receive electromagnetic radiation 14 at multiple antenna elements 12 that may, for example, be connected in series as shown to provide increased voltage to a voltage conditioner 72 or in parallel (not shown) to provide increased current to the voltage conditioner 72, the latter which may include filter elements such as capacitors and the like and/or DC to DC converters for providing power to a load 74. In this way the invention may scavenge or collect the energy from electromagnetic radiation 70 to be used to provide power to a device.

In alternative embodiments more than two elastically mounted conductive elements 24 may be placed in the gap between the conductors 18 and 20.

It is specifically intended that the present invention not be limited to the embodiments and illustrations contained herein, but include modified forms of those embodiments including portions of the embodiments and combinations of elements of different embodiments as come within the scope of the following claims.

We claim:

1. A rectification circuit comprising:

at least one input terminal receiving an AC signal;

a rectification unit communicating with the input terminal and providing:

(a) a first and second electrical conductor having corresponding first and second ends approaching each other across a gap;

(b) at least two elastically mounted conducting elements positioned within the gap to permit shuttling of electrons between each other and at least one of the first and second electrical conductors with vibration of the two elastically mounted conducting elements; and wherein at least one of an arrangement of the elastically mounted conducting elements with respect to the first and second electrical conductors and a shape of at least one of the elastically mounted conducting elements and the first and second electrical conductors includes a predetermined asymmetry to promote a predetermined direction of spontaneous symmetry breaking so that the conducting elements operate in a coupled mode to provide a non-zero average current flow between the first and second electrical conductor when excited by the AC signal.

2. The rectification circuit of claim 1 wherein the elastically mounted conducting elements have a static separation from a least one of the first and second ends of less than 100 nanometers.

3. The rectification circuit of claim 1 wherein the first and second electrical conductors are metallization layers on a planar substrate and the elastically mounted conducting elements are metallization layers on a top of pillars extending upward from the substrate from a depression between the first and second electrical conductors.

4. The rectification circuit of claim 3 wherein the substrate is a silicon-on-oxide substrate and the pillars terminate in an oxide layer of the silicon-on-oxide substrate for electrical isolation.

5. The rectification circuit of claim 3 wherein a height of the pillars is less than 1000 nm.

6. The rectification circuit of claim 3 wherein a diameter of the pillars is less than 100 nm.

7. The rectification circuit of claim 1 wherein the first and second electrical conductors are brachiated to have multiple first and second ends each with corresponding elastically mounted conducting elements the conducting elements operating in a coupled mode to provide parallel current flow between the first and second electrical conductors.

8. The rectification circuit of claim 1 further including a third and fourth electrical conductor having corresponding first and second ends approaching each other across a gap;

at least two elastically mounted conducting elements positioned within the gap to permit shuttling of electrons between each other and at least one of the third and fourth electrical conductors with vibration of the two elastically mounted conducting elements;

the conducting elements operating in a coupled mode to provide a net average current flow between the third and fourth electrical conductor when excited by an AC waveform applied across the first and second electrical conductor having an average value of zero;

wherein the second conductor is connected to the first conductor development to provide for serial current flow from the first conductor to the fourth conductor.

9. The rectification circuit of claim 1 wherein the rectification unit provides rectification in a first polarity at a first set of frequencies and further including a frequency filter selectively passing the first set of frequencies from the terminal to the rectification unit.

10. A method of rectifying electrical AC power comprising the steps of:

applying the AC power to at least one input terminal;

communicating the AC power across a rectification unit communicating with the input terminal and providing:

(a) a first and second electrical conductor having corresponding first and second ends approaching each other across a gap;

(b) at least two elastically mounted conducting elements positioned within the gap to permit shuttling of electrons between each other and at least one of the first and second electrical conductors with vibration of the two elastically mounted conducting elements; and wherein at least one of an arrangement of the elastically mounted conducting elements with respect to the first and second electrical conductors and a shape of at least one of the elastically mounted conducting elements and the first and second electrical conductors includes a predetermined asymmetry to promote a predetermined direction of spontaneous symmetry breaking so that the conducting elements operate in a coupled mode to provide a non-zero average current flow between the first and second electrical conductor when excited by the AC signal; and extracting an average DC current from at least one of the first and second electrical conductors.

11. The method of claim 10 including the step of constructing the elastically mounted conducting elements by etching a substrate to create pillars extending upward between the first and second conductors.

12. The method of claim 11 including the step of depositing metallization layers on top of pillars.

13. The method of claim 11 wherein a height of the pillars is less than 1000 nm and wherein the elastically mounted conducting elements have a static separation from a least one of the first and second ends of less than 100 nanometers and wherein a diameter of the pillars is less than 100 nm.

* * * * *